United States Patent
Werker et al.

(10) Patent No.: US 10,615,767 B2
(45) Date of Patent: Apr. 7, 2020

(54) EMC-FILTER

(71) Applicant: Hanon Systems, Daejeon (KR)

(72) Inventors: Stephan Werker, Merzenich-Golzheim (DE); Stefan Tydecks, Köln (DE); Wilfried Pfahl, Elsdorf (DE); Klaus Schulz, Frechen (DE)

(73) Assignee: Hanon Systems, Daejeon (KR)

( * ) Notice: Subject to any disclaimer, the term of this patent is extended or adjusted under 35 U.S.C. 154(b) by 0 days.

(21) Appl. No.: 15/942,986

(22) Filed: Apr. 2, 2018

(65) Prior Publication Data

US 2018/0323764 A1    Nov. 8, 2018

(30) Foreign Application Priority Data

May 2, 2017    (DE) .......................... 10 2017 109 321

(51) Int. Cl.
| | |
|---|---|
| *F25B 1/00* | (2006.01) |
| *H03H 1/00* | (2006.01) |
| *B60H 1/32* | (2006.01) |
| *H02M 7/00* | (2006.01) |
| *H03H 7/01* | (2006.01) |
| *H05K 1/18* | (2006.01) |
| *H05K 7/20* | (2006.01) |

(52) U.S. Cl.
CPC ............ *H03H 1/00* (2013.01); *B60H 1/3229* (2013.01); *H02M 7/003* (2013.01); *H03H 7/0115* (2013.01); *H05K 1/181* (2013.01); *H05K 7/2039* (2013.01); *B60H 1/3222* (2013.01); *H03H 2001/0021* (2013.01); *H05K 2201/10015* (2013.01); *H05K 2201/10272* (2013.01)

(58) Field of Classification Search
CPC .............................. B60H 1/3229; H03H 1/00
USPC ................... 62/501, 506, 507, 498; 417/411
See application file for complete search history.

(56) References Cited

U.S. PATENT DOCUMENTS

| | | | | |
|---|---|---|---|---|
| 2001/0012212 A1* | 8/2001 | Ikeda | .................... | H02M 7/003 363/141 |
| 2007/0176584 A1* | 8/2007 | Chen | ................. | H02M 3/33507 323/282 |
| 2008/0049477 A1 | 2/2008 | Fujino et al. | | |

(Continued)

FOREIGN PATENT DOCUMENTS

| | | |
|---|---|---|
| DE | 102005041051 A1 | 3/2006 |
| DE | 102012203796 A1 | 2/2013 |

(Continued)

OTHER PUBLICATIONS

J. Biela and J. W. Kolar, "Cooling Concepts for High Power Density Magnetic Devices", 2007 IEEE, pp. 1-8.

*Primary Examiner* — Anthony M Haughton
(74) *Attorney, Agent, or Firm* — Norton Rose Fulbright US LLP

(57) ABSTRACT

The invention which relates to an EMC filter (1) addresses the problem of specifying an EMC filter (1) that is simple of structure, cost-effective and temperature resistant. This problem is resolved thereby that the core of the choke (4, 5) is comprised of one or two core parts (10), that at least one first planar or convex heat transfer area (23) is located on an outside of the core and that the core with this first planar or convex heat transfer area (23) is disposed on a housing (12) of the refrigerant compressor, wherein the housing (12) in the region of the first planar or convex heat transfer area (23) is implemented planar or concave.

20 Claims, 4 Drawing Sheets

(56) References Cited

U.S. PATENT DOCUMENTS

| | | | | |
|---|---|---|---|---|
| 2015/0222170 A1* | 8/2015 | Berger | .................... | H02M 1/44 |
| | | | | 363/40 |
| 2018/0194200 A1* | 7/2018 | Ambo | ................... | B60H 1/3223 |
| 2018/0334116 A1* | 11/2018 | Sanvito | ................ | H05K 7/1432 |

FOREIGN PATENT DOCUMENTS

| | | |
|---|---|---|
| DE | 102015110064 A1 | 12/2016 |
| JP | 2010093202 A | 4/2010 |
| JP | 2010167871 A | 8/2010 |
| JP | 2012156496 A | 8/2012 |
| WO | WO 2014/112064 | 12/2004 |
| WO | 2016157411 A1 | 10/2016 |

\* cited by examiner

EMC-FILTER

CROSS REFERENCE TO RELATED APPLICATIONS

This application claims priority from German Patent Application No. 102017109321.4 filed May 2, 2017, which is hereby incorporated by reference in its entirety.

FIELD OF THE INVENTION

The invention relates to a passive EMC filter having at least one choke with a core and several capacitors.

BACKGROUND OF THE INVENTION

In electronic componentry, in which switching processes are carried out with electric voltages or currents, interferences are generated as a consequence of these switching processes due to the generated electrical pulses with the associated emission of interference signals. These interferences can propagate as electromagnetic waves conductively across lines as well as also radiatively through free space.

The capability of a technical device not to subject other devices to unintentional or accidental electric or electromagnetic effects or be subjected to same by other devices, is referred to as electromagnetic compatibility (EMC).

To avoid or minimize the propagation of such interferences, prior art proposes equipping this componentry with a filter unit, a so-called EMC filter or network filter. It is also known to take measures for shielding or screening the electronic componentry in order to avoid impacting the correct functions of other electronic components or devices through interference signals of too high an amplitude level.

Such EMC filters are also utilized in hybrid and electric motor vehicles for example. The present description refers, in particular, to the use of EMC filters in electrical refrigerant compressors of motor vehicles in order to ensure that specified electromagnetic limit values are observed.

The magnitudes of such interference signals that must be observed by a device in circulation are established in EMC standardizations associated with this device and described by means of limit values that must be observed.

Known in this context are for example the so-called ECE provisions which include a catalog of international agreements on uniform technical regulations for motor vehicles as well as parts and equipment objects of motor vehicles. The area of radio interference suppression is treated, for example, in ECE R10, which has to be followed in future developments and which will result in further decrease of the permissible interference radiation.

Electromagnetic interference radiation is also generated in the operation of electric inverters that actuate an electric motor and thus switch currents of high amplitude. Such an inverter is utilized, for example, in actuating a motor in an air conditioner compressor of a motor vehicle.

A known solution for suppressing the interference radiation on electric or electronic components is the use of a passive EMC filter which is inserted, for example, in a feed line of the operating voltage. Such passive EMC filters are conventionally realized with the aid of passive components such as capacitors, coils and resistors which are connected in known, suitable manner and consequently generate the desired filter effect.

Based on the type of interferences to be filtered by means of an EMC filter, the distinction is made between common mode interference and differential mode interference. The interference spectrum to be filtered by the EMC filter is in practice comprised of the sum of both superposed interference components.

The type, structure and especially the voltage level of an inverter, for example for an electric refrigerant compressor, determine which of the two interference components is predominant and, consequently, which of the two interference components must be filtered more strongly.

In the case of inverters for refrigerant compressors that are operated in a voltage range of approximately 48 V, primarily differential mode interferences occur due to the low operating voltage and the simultaneously high arising currents in a range of, for example, 100 A to 200 A.

Prior art proposes filtering such differential mode interferences by employing so-called chokes in combination with capacitors in a passive EMC filter. For this purpose, for example, in each feed line of the inverters HV+ and HV− one choke $L_1$ and $L_2$ each is inserted and corresponding capacitors $C_1$ and $C_2$ are disposed in feed lines HV+ and HV− before and after the chokes $L_1$ and $L_2$. In addition, in passive EMC filters a third capacitor $C_3$ is connected between the input line HV− and ground potential and a fourth capacitor $C_4$ between the input line HV+ and ground potential.

Chokes as coils or inductors are known for limiting currents in electric lines, for the intermediate storage of energy in the form of their magnetic field, for impedance matching or for filtering. Such chokes are frequently inserted into a voltage feed line of an electric component. To enhance their so-called inductive reactance or reactance, chokes frequently include a soft magnetic core. It is known to utilize as the soft magnetic materials ferromagnetic substances that can be readily magnetized in a magnetic field.

Through the chokes $L_1$ and $L_2$, disposed in the feed lines HV+ and HV− of the inverter, flows the maximally possible input current of the inverter which can be in the range of 150 A and more, and these chokes must consequently be appropriately dimensioned for this current load.

This high interference-superimposed input current engenders in chokes $L_1$ and $L_2$ a magnetic field. In contrast to so-called common mode chokes, in which, due to the counter directed windings of the two choke windings disposed on a common core the magnetic fields of the input currents in the common core cancel each other out, this positive effect does not occur in the case of differential mode chokes.

It is therefore technically not sensible to construct differential mode chokes, or chokes with which differential mode interferences are to be reduced, with their windings on a common core since the magnetic fields of both windings in the core are superimposed and so-called saturation effects occur earlier in such a configuration.

Due to the relatively high input currents in a range equal to or greater than 150 A at an operating voltage of, for example, 48 V, in the cores of the chokes or differential mode chokes considerable core losses occur with a power loss of several watt. These losses are determined by the properties of the core material utilized and the winding structure.

This power loss leads to heating of the core of the chokes whereby, in turn, the core properties are changed. It is especially disadvantageous that with the heating of a ferrite core its magnetic properties change such that the maximal flux density decreases before the occurrence of saturation effects.

According to prior art it is customary to operate, for example, a ferrite core of a choke of a passive EMC filter without a cooling system. Due to the heating, the components of such an EMC filter, especially the choke, are overdesigned in order to ensure reliable, interference free operation of the inverter as well as other componentries in the proximity of the inverter.

It can, alternatively, also be provided that air is conducted through the core of a choke or of a transformer, which is also referred to as active air cooling.

It is, in addition, also known to move a coolant through the core of a choke or a transformer, which is also referred to as active liquid cooling.

In the field of power electronics there is a trend toward higher power densities. In order to be able to achieve these increased power densities, the systems need to be designed optimally with respect to topology and semiconductor selection. Furthermore, the installation volume of the components is to be decreased. However, the decreasing volume in connection with a reduced surface impedes the possibilities for adequate cooling of such components.

A solution for cooling such components is found in the document "Cooling Concepts for High Power Density Magnetic Devices" by J. Biela and J. W. Kolar at http://www.pes.ee.ethz.ch/uploads/tx_ethpublications/biela_PCC07.pdf which consists in utilizing a heat pipe as heat exchanger, wherein the heat pipe, utilizing the heat of evaporation of a medium, can transport a heat quantity, for example, from a first end of the heat pipe to its second end.

However, such cooling methods can only be implemented in an electric refrigerant compressor of a vehicle, such as for example a motor vehicle, using technically complex and installation and cost intensive means.

OBJECTS OF THE INVENTION

The objective of the invention comprises specifying an EMC filter which is of simple structure as well as cost-effective and temperature-resistant.

SUMMARY OF THE INVENTION

The objective is achieved through a subject matter with the characteristics according to the invention described herein.

The EMC filter is comprised of several passive components, such as coils and capacitors.

In a conventional circuit configuration of a passive EMC filter, chokes are disposed in the feed lines HV+ and HV− of an inverter. In addition, capacitors or capacitances are provided between the feed lines HV+ and HV− before and after the chokes as well as in each case between ground potential and feed lines HV+ and the feed line HV−.

Due to the high currents, the chokes provided in such passive EMC filter are implemented with a bus bar, for example comprising copper or a copper alloy, a so-called copper bus bar, as the electrical conductor. It is provided to hold the number of requisite windings for the chokes very low through suitable selection of the magnetic material for the core of the choke.

A specific implementation provides implementing the windings in the form of a copper bus bar curved in the shape of a U that is received in a ferrite core. The winding used in this implementation consequently has a winding number of only one winding.

A unitary ferrite core can be provided with any chosen body, such as for example an annulus or a toroid. To simplify the fabrication of such a choke, it is also provided to fabricate the core of the choke of at least two parts. In this way it is, for example, possible, using two C-shaped cores or ferrite cores, to place the previously curved U-shaped core or copper bus bar into the first of the C-shaped core and to cover it with the second C-shaped core and in this way obtain a finished core that encompasses the winding or the bus bar. Such a core can be developed in a shape that is, for example, cuboid or annular.

A partitioning of the core, for example onto four subcores, which, after assembly, yield the required core of the choke, is also feasible.

With the restriction that the core comprises at least one outer planar or convex area, which in the following will be denoted as heat transfer area, the outer shape can be devised freely. For example, the core can have the shape of a cube, a cuboid or also a sphere with a planar area. Alternatively, a subregion of the surface of the sphere with a convex surface contour can also be selected as the heat transfer area.

It is furthermore advantageous for the core to comprise two outer planar or convex areas, wherein these are preferably disposed oppositely such that, for example the two planar areas are oriented parallel to one another on the outer wall of the core.

The invention provides disposing the core of the choke with the, or one of the, planar implemented heat transfer areas on a housing of a refrigerant compressor that, in the region of the heat transfer area of the core, has a planar-shaped surface and in this way drain the heat from the core into the housing. This placement on the outer wall of the housing of the refrigerant compressor is carried out such that between the core and the housing low resistance to heat transfer develops whereby the heat can be better dissipated from the core. As low resistance to heat transfer is viewed a value of 10 kelvin per watt or less.

The surface of the housing, which can be produced using a casting process and consequently has a rough surface, can be milled, rubbed or ground level. To improve the heat dissipation from the core into the housing of the refrigerant compressor, a thermally conductive paste, a thermally conductive mat or a thermally conductive pad, such as a so-called "gap pad", can additionally be disposed between the heat transfer area of the core and the housing.

Such gap pads, also known as thermal interface or thermally conductive material and intended to improve the heat transfer between two surfaces, can be adherent on one or both sides and thus enable a sound and reliable securement of the core on the housing. It is furthermore feasible to compensate by means of a gap pad any unevenness or surface roughness. As the material for a gap pad can be utilized for example a filled, thermally conductive polymer on rubber coated glass fiber material which has a thermal conductivity of 1.0 W/mK for example.

These properties of a gap pad ensure improved heat transfer between the heat transfer area of the core and the housing even in the case of occurrences of tolerances of manufacturing processes, for example with respect to the surface quality of parts. Moreover, through the gap pad the vibration resistance and the tolerance compensation of the structure is improved. Consequently, it is ensured that under vibration the components cannot vibrate freely.

If a core with a convex heat transfer area is utilized, it is provided that the housing of the refrigerant compressor in the region of the convex heat transfer area is concave and consequently the contour of the surfaces of core and housing are matched to one another in the region of the heat transfer area. This matching enables good heat transfer of the heat from the core into the cooled housing of the refrigerant compressor.

In an implementation of the invention it is provided that a core, comprised for example of two halves, of a choke of an EMC filter is disposed with its first planar or convex heat transfer area on a housing of a refrigerant compressor. A gap pad is optionally disposed between the heat transfer area and the housing. Provided for the safe securement of the core is a bracket which, in the case of a cuboidal core, is implemented for example in the shape of a U and disposed over the core and which is secured with its ends on the housing of the refrigerant compressor. This securement can be accomplished by means of an adhesive or by means of suitable plate washers to receive securement means, such as screws, bolts or adjusting pins. These securement means are connected with the housing and consequently secure the bracket.

If a core of different shape is utilized, the bracket is correspondingly adapted to the shape used.

After it has been bolted on, the bracket presses the core firmly against the housing of the refrigerant compressor through which flows a coolant. This coolant is utilized in the generation of the refrigerating capacity in the arrangement of the refrigerant compressor.

In the case in which the core is equipped with two opposing planar and/or convex heat transfer areas, between the second heat transfer area, facing away from the housing of the refrigerant compressor, and the bracket a thermally conductive paste or a gap pad can also be inserted. In this case the heat on the second heat transfer area can be dissipated via the thermally conductive paste or the gap pad into the bracket comprised of a thermally conductive material and be conducted to the housing across the bracket. Therewith the core can be cooled from two sides.

The structural unit, which comprises the core of the choke, the bracket, the U-shaped curved bus bar of copper or a copper alloy as well as a circuit board to receive the electrical and electronic components necessary for the inverter, can be encompassed or covered by a covering or a cap. In this way a volume is created on a housing wall of the refrigerant compressor and this structural unit is protected against penetrating dirt or moisture.

In an alternative implementation of the invention it is provided that a core, comprised of two halves for example, of a choke of a passive EMC filter is disposed with its first heat transfer area on a housing of a refrigerant compressor. Between the heat transfer area and the housing a gap pad is optionally disposed.

In this case a sound and reliable securement of the core on the surface of the housing is achieved thereby that the core is provided with two opposing heat transfer areas. It is provided that the first heat transfer area is placed on the housing. The second heat transfer area is in contact on the covering or cap. The core is consequently clamped between the housing and the covering or cap. In this case a thermally conductive paste or a gap pad can also be provided on the heat transfer areas in order to enable better heat dissipation through lower resistance to heat transfer. In this example the heat transfer areas can also be implemented such that they are planar or convex, with the surface of the housing or the cap being implemented planar or concave in accordance with the surface contour of the core in the region of the heat transfer area. The implementation of a core with a first planar and a second convex heat transfer area or conversely, is also conceivable.

The covering or cap is fabricated of a thermally conductive material, such as a metal, and can be secured to the housing of the refrigerant compressor by means of bolts or fasteners.

In this implementation the heat can also be drained from the core across the two heat transfer areas. The heat can therewith, on the one hand, be dissipated directly into the housing and, on the other hand, across the cap to the housing of the refrigerant compressor.

The advantages of the invention, consequently, reside in a greater load carrying capacity of the filter core of the choke of a passive EMC filter. In addition, savings of the required installation space and costs are achieved.

Further details, characteristics and advantages of implementations of the invention are evident in the subsequent description of embodiment examples with reference to the associated drawing.

DETAILED DESCRIPTION

Figure 1:
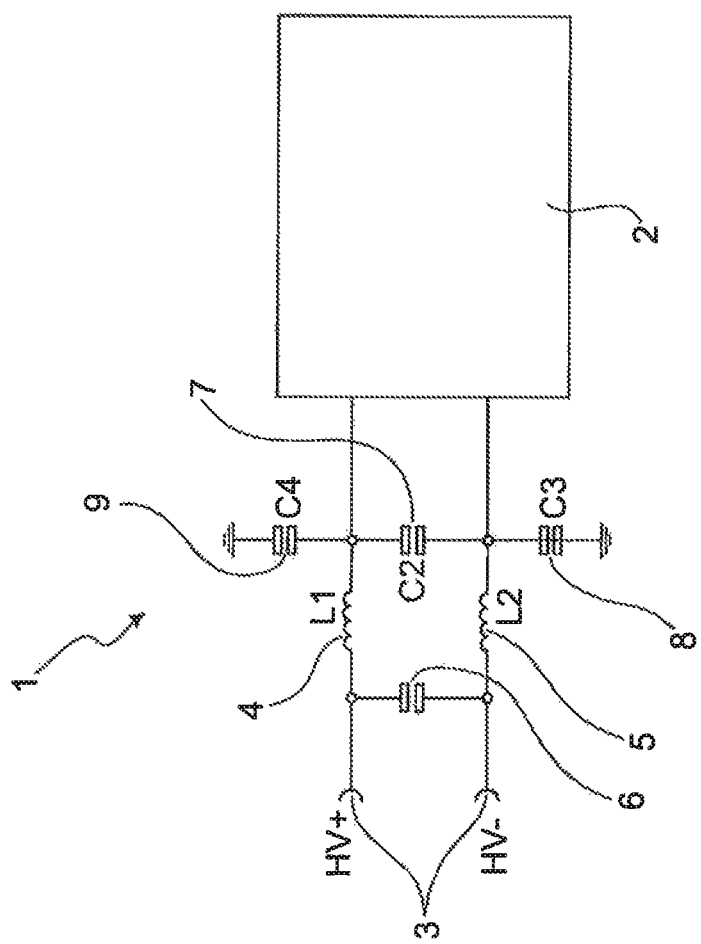
FIG. 1: an exemplary circuit configuration of a passive EMC filter according to prior art.

FIG. 1 shows an exemplary circuit configuration of a passive EMC filter 1 according to prior art, which is connected to an inverter 2. The EMC filter 1 includes an input 3 at which, for example a voltage of 48 V can be applied, and comprises the chokes $L_1$ 4 and $L_2$ 5 disposed in feed lines HV+ and HV−. While the first capacitor 6 denoted $C_1$ is disposed between lines HV+ and HV− directly at the input of the passive EMC filter 1 and before the chokes $L_1$ 4 and $L_2$ 5, the second capacitor 7, denoted $C_2$ is disposed after chokes $L_1$ 4 and $L_2$ 5 at the input of inverter 2.

The third capacitor 8 denoted $C_3$ is disposed between line HV− and ground potential. The fourth capacitor 9 denoted $C_4$ is disposed between line HV+ and ground potential.

In this known circuit configuration on a housing 12 a core, disposed according to the invention on a housing 12 of a refrigerant compressor, can be found in the first choke 4 and optionally also in the second choke 5.

Figure 2A:
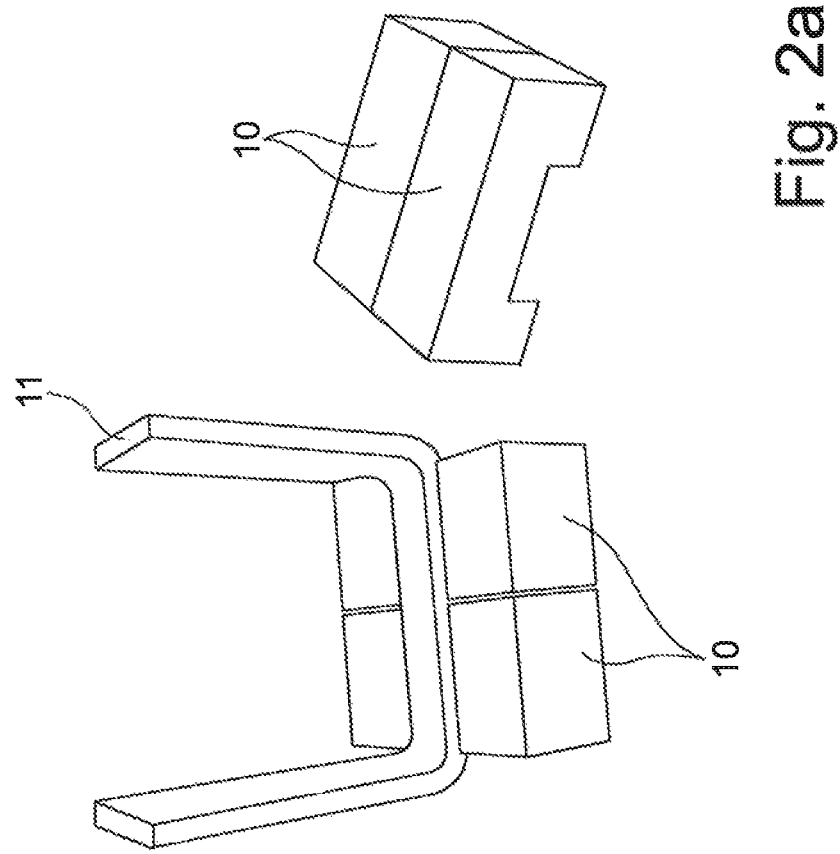
FIG. 2, 2a: a core, comprised of four parts, of a choke.
Figure 2:
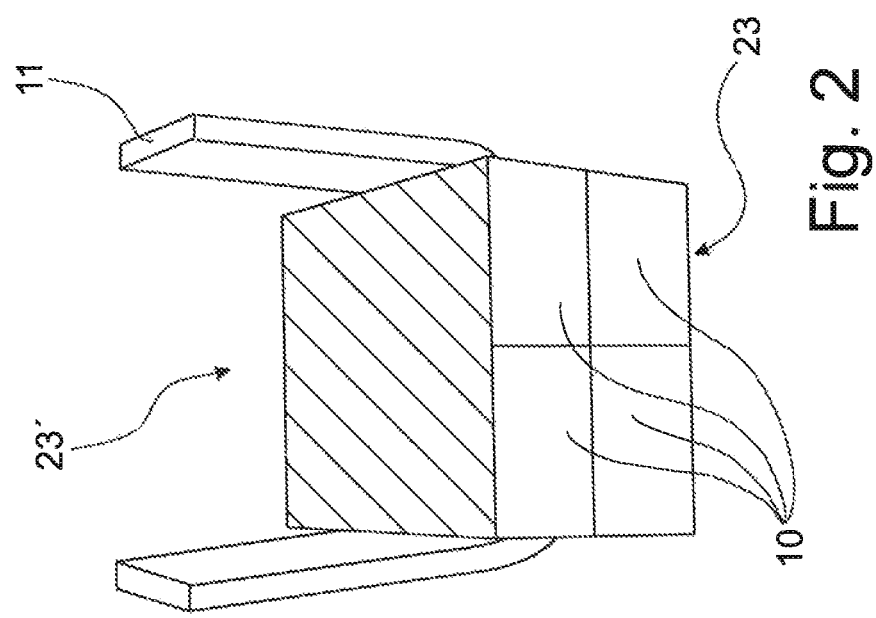

In FIGS. 2 and 2a is depicted a core, comprised of four parts, of a choke 4 or a choke 5 from FIG. 1. The core could alternatively also be comprised of two parts.

In FIG. 2 shown on the left the core with its four core parts 10 is depicted after assembly and encompasses the bus bar 11 of copper which represents the winding of choke 4 or choke 5.

On the right of FIG. 2a the two upper core parts 10 are depicted after they have been raised. It can be seen that the core parts 10 are implemented in C form and through this specific form enable receiving the bus bar 11 having a rectangular cross section. The core parts 10 in the assembled state of the core are firmly secured in their position by suitable, not shown, means.

In the core depicted in FIG. 2 a first planar heat transfer area 23 is developed on the undersurface of the core. A second planar heat transfer area 23', oriented parallel to the first heat transfer area 23, is developed on the upper surface of the core and is indicated in FIG. 2 by means of simple hatching.

Figure 3:
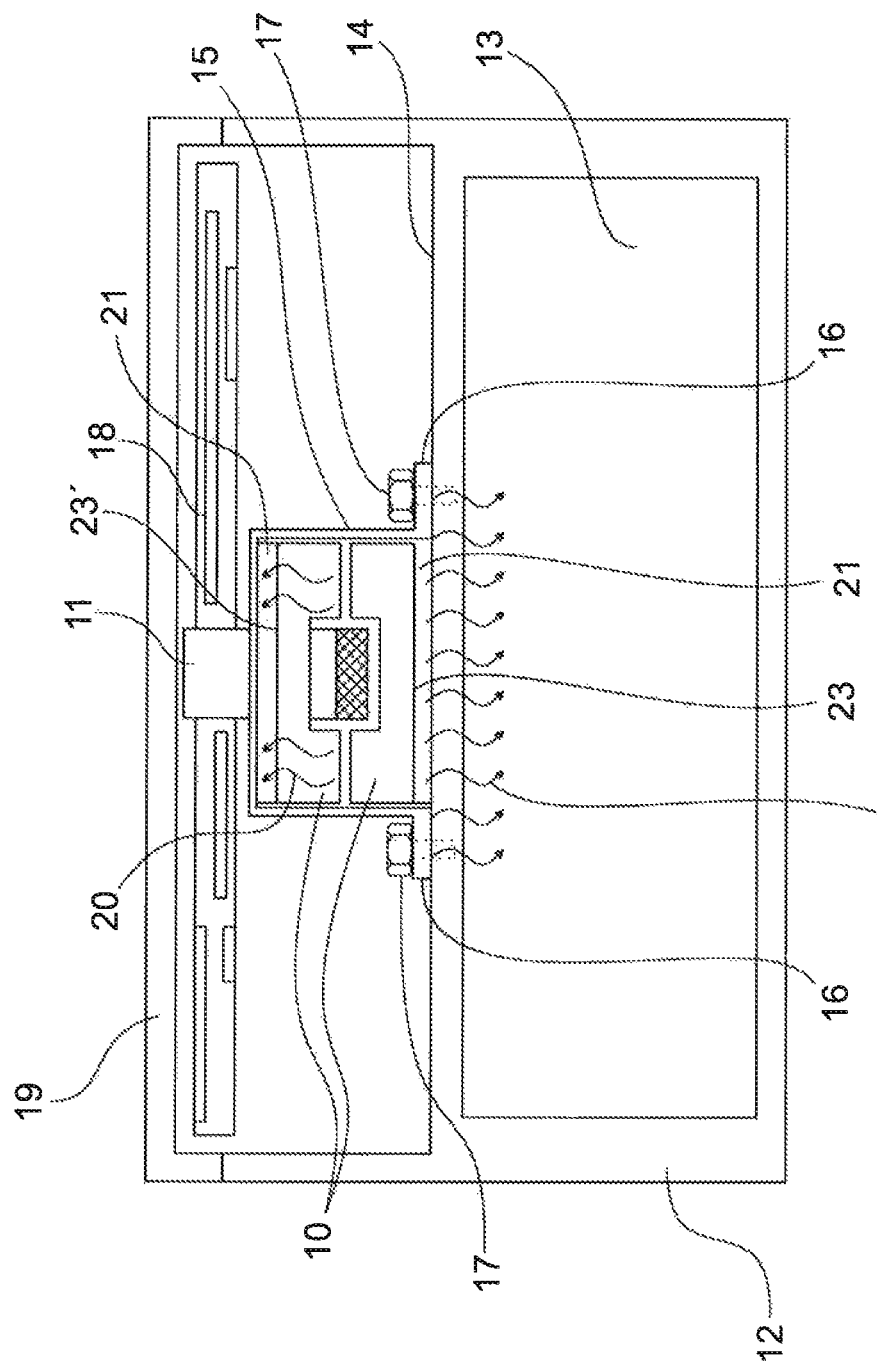
FIG. 3: a first embodiment of the invention.

FIG. 3 shows a first embodiment of the invention. Into a housing 12 of a refrigerant compressor a coolant 13 is introduced which is completely enclosed by the housing 12.

Housing 12 is produced of a metallic material, for example as an injection molded part, and has good thermal conductivity.

On a surface 14 of housing 12 a core is disposed, comprised of two C-shaped core parts 10, of a choke 4, 5 of a passive EMC filter 1. For the safe securement of the core with its first planar heat transfer area 23 on the planar surface 14 of housing 12 and for a firm coherence of the core parts 10, a U-shaped bracket 15 is to be disposed. This bracket 15 can be adhered at its ends to the surface 14. Alternatively, the ends of the bracket 15 can be implemented with plate washers 16 having holes through which the plate washers 16 of the bracket 15 can be bolted to the housing 12.

The core is consequently connected with its second planar heat transfer area 23' to the bracket 15 such that it is thermally conductive.

It is, alternatively, feasible to dispose the core with its first convex heat transfer area 23 on a concave surface 14 of housing 12 and, for a firm coherence of the core parts 10, to dispose a bracket 15 formed corresponding to the surface of the core. This implementation of the core with a convex surface in the region of the heat transfer area 23 is not shown in FIGS. 1 to 4.

FIG. 3 shows in sectional representation the core as well as the bus bar 11 extending through the core. In the example in FIG. 3, in which the core has a rectangular opening, the bus bar 11 is implemented with a rectangular cross section area. It is understood that the cross section can also have a different shape, such as a square area, an n-gonal area or a circular area and be adapted to the opening of the core. The ends of the windings of the choke, also of the bus bar 11, extending upwardly in FIG. 3 are electrically connected to the circuit board 18 of the inverter. Such a connection can be implemented for example as a bolt or a solder connection. On this multi-layer circuit board 18 the capacitors 6, 7, 8 and 9 that belong to the passive EMC filter 1 can be disposed. In addition, on the, for example, multi-layer circuit board 18 the components associated with the inverter 2 are disposed.

The described elements can be covered by means of a cap 19 and thus can be safely placed against penetration of dirt and moisture.

As is intended to be shown by the wavy arrows, the heat 20 in the lower region of the core can drain directly, or be dissipated across a thermally conductive layer 21, to the housing 12 cooled with coolant 13. Such a thermally conductive layer 21 can be a thermally conductive paste, a thermally conductive adhesive or a gap pad.

In the upper region of the core the heat 20 can be dissipated across the bracket 15 to the housing 12. In this way improved cooling of the core of a choke 4, 5 in a passive EMC filter 1 is achieved. This improved cooling serves for maintaining parameters which ensure the reliable function of the choke 4, 5 and consequently of the EMC filter 1. Through the improved cooling, in addition, the overdesigning of structural parts, in particular of the choke 4, 5, can be dispensed with, which results in savings of costs and materials.

Figure 4:
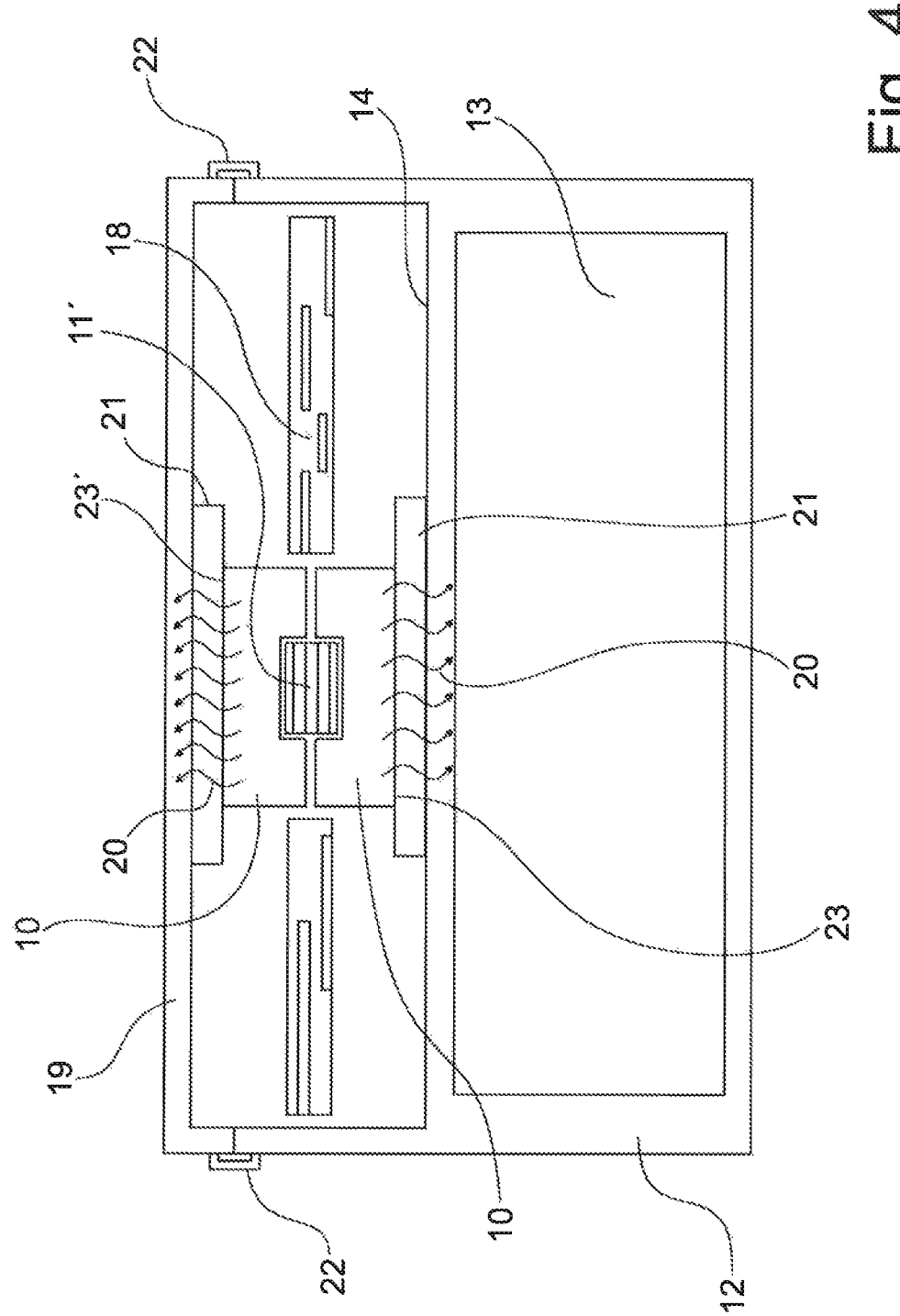
FIG. 4: a second, alternative embodiment of the invention.

In FIG. 4 an alternative second embodiment of the invention is shown. In housing 12 of the refrigerant compressor a coolant 13 is introduced which is completely enclosed by housing 12. Housing 12 is fabricated of a metallic material, for example as an injection molded part, and has good thermal conductivity.

On a surface 14 of housing 12 a core, comprised of two C-shaped core parts 10, of a choke 4, 5 of a passive EMC filter 1 is disposed. For the safe securement of the core with its first planar heat transfer area 23 on the planar surface 14 of the housing 12, a cap 19 is provided which is placed onto the edge of the housing 12 and securely closes off the volume in which the choke 4, 5 as well as the circuit board 18 of inverter 2 are disposed.

The secure hold of the core is achieved thereby that the first planar heat transfer area 23 is in contact on housing 12, while the second planar heat transfer area 23', located parallel to the first heat transfer area 23, is in contact on a planar inner wall of cap 19.

Stated differently, the core is firmly clamped between the housing 12 and the cap 19.

In this embodiment it is also provided to insert a thermally conductive layer 21, such as a thermally conductive paste or a gap pad, between the first planar heat transfer area 23 of the core and the planar surface 14 of the housing 12. Similarly, between the second planar heat transfer area 23' of the core and the cap 19 a further thermally conductive layer 21 is disposed. The two thermally conductive layers 21, implemented as gap pads for example, therewith improve the heat dissipation in the upper and lower regions of the core and serve for the secure hold of the core even in the presence of customarily occurring vibrations in a refrigerant compressor of a motor vehicle.

The core can, alternatively, be disposed, for example, with its first convex heat transfer area 23 on a concave surface 14 of housing 12. The second heat transfer area 23 can also be implemented convex or planar. If the second heat transfer area 23 is implemented convex, a concave region is provided in the cap to receive the core and to hold it securely. If the second heat transfer area 23 is implemented planar, in the cap a region for the heat transfer area 23 is also implemented planar.

In the example depicted in FIG. 4 the winding of choke 4, 5 is disposed in the circuit board 18. In the multi-layer circuit board 18 copper tracks in several planes, which run in the interior of the core and are electrically interconnected, are utilized for forming the winding in the core. For this purpose, in the circuit board 18 appropriate notches are provided in order to be able to arrange the core, comprised of two core parts 10, about the portion of the circuit board 18 which represents the winding of choke 4, 5. The portion of the circuit board 18 that represents the winding of choke 4,5 or the bus bar, is denoted in FIG. 4 by the reference number 11.

On the circuit board 18 are additionally located the capacitors 6, 7, 8 and 9 associated with the passive EMC filter 1, as well as the components associated with the inverter 2.

As is shown in FIG. 3, the winding of choke 4, 5 can alternatively also be implemented in the form of a U-shaped bus bar 11.

In the lower region of the core the heat 20 can be dissipated directly from the core across thermally conductive layer 21 into the cooled housing 12 of the refrigerant compressor. In the upper region of the core the heat 20 is dissipated into the cap 19 and across it to the housing 12. In this embodiment, consequently, improved cooling of the core of a choke 4, 5 in a passive EMC filter 1 can also be achieved.

To secure the cap 19 on the housing 12 of the refrigerant compressor, at least two fasteners 22 can be applied which serve for the safe securement of cap 19 on housing 12 and also allow opening the cap for maintenance and repair work.

LIST OF REFERENCE NUMBERS

1 EMC filter
2 Inverter

3 Input (HV+/HV−)
4 First choke $L_1$
5 Second choke $L_2$
6 First capacitor $C_1$
7 Second capacitor $C_2$
8 Third capacitor $C_3$
9 Fourth capacitor $C_4$
10 Core parts of choke
11, 11' Bus bar
12 Housing
13 Coolant
14 Surface
15 Bracket
16 Plate washer
17 Bolt
18 Circuit board
19 Cap
20 Heat
21 Thermally conductive layer (gap pad)
22 Fasteners
23, 23' Heat transfer area

The invention claimed is:

1. An electromagnetic compatibility (EMC) filter connected to an inverter of a refrigerant compressor and comprising at least one choke with a core and several capacitors, wherein the core of the choke is developed having one or two core parts,
   wherein at least one first planar or convex heat transfer area is disposed on an outside of the core,
   wherein the core with this first planar or convex heat transfer area is disposed on a housing of the refrigerant compressor,
   wherein the housing in the region of the first planar or convex heat transfer area is implemented planar or concave;
   wherein as the winding of the choke in the core a bus bar is disposed; and
   wherein the bus bar is electrically conducting connected to the circuit board of the inverter and wherein the capacitors of the passive EMC filter are disposed on the circuit board.

2. An EMC filter as in claim 1, wherein a second planar or convex heat transfer area is disposed on the outside of the core, and
   wherein the second planar or convex heat transfer area is disposed oriented in parallel or oppositely to the first planar or convex heat transfer area.

3. An EMC filter as in claim 1, wherein a bracket is disposed on a second planar or convex heat transfer area of the core and
   wherein the bracket is connected with the housing.

4. An EMC filter as in claim 1, wherein a cap is disposed on a second planar or convex heat transfer area of the core,
   wherein the cap is connected with the housing, and
   wherein the cap in the region of the second planar or convex heat transfer area is implemented planar or concave.

5. An EMC filter according to claim 1, wherein a thermally conductive layer is disposed between the first planar or convex heat transfer area and the housing.

6. An EMC filter according to claim 1, wherein a thermally conductive layer is disposed between the second planar or convex heat transfer area and the bracket or the cap.

7. An EMC filter according to claim claim 5, wherein a thermally conductive paste or a gap pad is disposed as the thermally conductive layer.

8. An EMC filter according to claim 1, wherein plate washers are disposed on a bracket plate,
   wherein the plate washers include holes for screws, bolts or adjusting pins; and
   wherein the bracket and the plate washers are bolted or secured on the housing with the screws, the bolts or the adjusting pins.

9. An EMC filter as in claim 2, wherein a cap is disposed on the second planar or convex heat transfer area of the core, and
   wherein the cap is connected with the housing,
   wherein the cap in the region of the second planar or convex heat transfer area is implemented planar or concave.

10. An EMC filter according to claim 2, wherein a thermally conductive layer is disposed between the first planar or convex heat transfer area and the housing.

11. An EMC filter according to claim 3, wherein a thermally conductive layer is disposed between the first planar or convex heat transfer area and the housing.

12. An EMC filter according to claim 4, wherein a thermally conductive layer is disposed between the first planar or convex heat transfer area and the housing.

13. An EMC filter as in claim 2, wherein a bracket is disposed on a second planar or convex heat transfer area of the core and
   wherein the bracket is connected with the housing.

14. An EMC filter as in claim 2, wherein a bracket is disposed on a second planar or convex heat transfer area of the core and
   wherein the bracket is connected with the housing.

15. An EMC filter as in claim 4, wherein a bracket is disposed on a second planar or convex heat transfer area of the core and
   wherein the bracket is connected with the housing.

16. An EMC filter according to claim 4, wherein a thermally conductive layer is disposed between the first planar or convex heat transfer area and the housing.

17. An EMC filter according to claim 3, wherein plate washers are disposed on a bracket plate,
   wherein the plate washers include holes for screws, bolts or adjusting pins; and
   wherein the bracket and the plate washers are bolted or secured on the housing with the screws, the bolts or the adjusting pins.

18. An EMC filter according to claim 4, wherein plate washers are disposed on a bracket plate,
   wherein the plate washers include holes for screws, bolts or adjusting pins; and
   wherein the bracket and the plate washers are bolted or secured on the housing with the screws, the bolts or the adjusting pins.

19. An EMC filter according to claim 5, wherein plate washers are disposed on a bracket plate,
   wherein the plate washers include holes for screws, bolts or adjusting pins; and
   wherein the bracket and the plate washers are bolted or secured on the housing with the screws, the bolts or the adjusting pins.

20. An EMC filter according to claim 6, wherein plate washers are disposed on a bracket plate,
   wherein the plate washers include holes for screws, bolts or adjusting pins; and
   wherein the bracket and the plate washers are bolted or secured on the housing with the screws, the bolts or the adjusting pins.

* * * * *